United States Patent
Lee et al.

(10) Patent No.: US 6,716,733 B2
(45) Date of Patent: Apr. 6, 2004

(54) CVD-PVD DEPOSITION PROCESS

(75) Inventors: Wei Ti Lee, San Jose, CA (US); Ted Guo, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/170,128

(22) Filed: Jun. 11, 2002

(65) Prior Publication Data

US 2003/0228746 A1 Dec. 11, 2003

(51) Int. Cl.$^7$ .................. H01L 21/3205; H01L 21/4763
(52) U.S. Cl. ........................ 438/586; 438/675
(58) Field of Search ................ 438/586, 589, 438/592, 597, 629, 637, 648, 668, 672, 675, 680, 688

(56) References Cited

U.S. PATENT DOCUMENTS

| | | | |
|---|---|---|---|
| 5,250,465 A | * 10/1993 | Iizuka et al. | 438/626 |
| 5,804,501 A | * 9/1998 | Kim | 438/627 |
| 5,877,087 A | 3/1999 | Mosely et al. | 438/656 |
| 5,918,118 A | 6/1999 | Kim et al. | 438/238 |
| 5,985,758 A | 11/1999 | Kim | 438/653 |
| 6,054,382 A | 4/2000 | Hsu et al. | 438/628 |
| 6,057,236 A | * 5/2000 | Clevenger et al. | 438/680 |
| 6,066,358 A | 5/2000 | Guo et al. | 427/99 |
| 6,077,781 A | 6/2000 | Guo et al. | 438/688 |
| 6,139,697 A | 10/2000 | Chen et al. | 204/192.15 |
| 6,355,558 B1 | * 3/2002 | Dixit et al. | 438/642 |
| 6,355,560 B1 | 3/2002 | Mosely et al. | 438/648 |
| 6,479,389 B1 | * 11/2002 | Tsai et al. | 438/697 |
| 2001/0005629 A1 | * 6/2001 | Singhvi t al. | 438/653 |
| 2001/0053586 A1 | 12/2001 | Lee et al. | 438/481 |

FOREIGN PATENT DOCUMENTS

| | | | |
|---|---|---|---|
| EP | 0 856 884 A3 | 8/1998 | H01L/21/768 |
| EP | 0 856 884 A2 | 8/1998 | H01L/21/768 |

OTHER PUBLICATIONS

"CVD–PVD Aluminum Process for DRAM Applications". Lee, W–J.; Kim, J.J.; Lee, S.J.; Park, J.W.; and Park, H.L.Interconnect Technology Conferenence, 2001, Proceedings of the IEEE 2001 International, pp. 75–77.*

* cited by examiner

Primary Examiner—Michael S. Lebentritt
Assistant Examiner—Beth E. Owens
(74) Attorney, Agent, or Firm—Moser, Patterson & Sheridan, LLP

(57) ABSTRACT

The present invention relates to a method for depositing metal layers on substrates with improved surface morphology. According to one aspect of the invention, a metal is deposited by chemical vapor deposition on a substrate having an aperture formed therein. A metal is then deposited on the substrate by physical vapor deposition performed with a low substrate temperature. The substrate is then heated. The substrate may then receive a metal deposited by physical vapor deposition performed at a high temperature and an additional heating step. The aperture of the resulting substrate is filled with metal and is substantially void-free and has a smooth surface morphology.

45 Claims, 7 Drawing Sheets

CVD-PVD DEPOSITION PROCESS

BACKGROUND OF THE INVENTION

1. Field of the Invention

Embodiments of the present invention generally relate to semiconductor processing and integrated circuits. More particularly, the invention relates to the deposition of metal in apertures to form uniform, void-free interconnections between conducting layers in high aspect ratio applications.

2. Description of the Related Art

Sub-quarter micron multilevel metallization is one of the key technologies for the next generation of very large scale integration (VLSI). The multilevel interconnects that lie at the heart of this technology require planarization of high aspect ratio apertures, including contacts, vias, lines or other features having aperture widths less than 0.25 μm and aperture depths greater than the aperture widths. Reliable formation of these interconnects is very important to the success of VLSI and to the continued effort to increase circuit density and quality on individual substrates and die.

Metal interconnects are typically formed by physical vapor deposition (PVD), chemical vapor deposition (CVD), electrochemical deposition and/or sequential combinations thereof. Generally, PVD metal films provide superior reflectivity because of better crystalline growth and orientation of the deposited atoms. However, because PVD generally requires directional sputtering from a target in a given direction, it is difficult to achieve conformal layers on semiconductor features, i.e., a layer of uniform thickness on the sides and base of the features. On the other hand, CVD metal films provide excellent conformal coverage of features but less superior crystalline orientation and thus lower reflectivity. Highly oriented crystalline growth of conducting layers is desirable because of the contribution of crystalline growth and orientation to electromigration resistance. Electromigration is a diffusive process in which the atoms of a solid move from one place to another under the influence of electrical forces. Electromigration can result in voids and thus limits the maximum current that can be carried by a conductor without its rapid destruction.

Aluminum (Al) layers formed by chemical vapor deposition, like other CVD processes, provide good conformal aluminum layers for very small geometries, including sub-quarter micron (<0.25 μm) apertures, at low temperatures. Therefore, CVD of aluminum is a common method used to fill small apertures. However, recent transmission electron microscopy data (TEM) has revealed that voids exist in many of the apertures deposited with CVD Al even though electric tests of these same apertures do not evidence the existence of a void. Furthermore, aluminum deposited by currently used CVD processes typically exhibits a rough surface morphology, poor crystalline growth, and low reflectivity.

TEM studies of various CVD Al layers formed on substrates indicate that the formation of voids occurs through a key hole process wherein the top portion of the via becomes sealed before the via has been entirely filled. Although a thin conformal layer of CVD Al can typically be deposited in high aspect ratio contacts and vias at low temperatures to line the walls and the bottom of the features, continued CVD deposition to completely fill the contacts or vias typically results in the formation of voids therein. Extensive efforts have been focused on elimination of voids in metal layers by modifying CVD processing conditions. However, the results have not yielded a satisfactory method of manufacturing void free structures.

An alternative technique for metallization of high aspect ratio apertures is hot planarization of aluminum through physical vapor deposition (PVD). The first step in this process requires deposition of a thin layer of a refractory metal such as titanium (Ti) on a patterned wafer to form a wetting layer which facilitates flow of the Al during the PVD process. Following deposition of the wetting layer, the next step requires deposition of either (1) a hot PVD Al layer, or (2) a cold PVD Al layer followed by a hot PVD Al layer onto the wetting layer. However, hot PVD Al processes are very sensitive to the quality of the wetting layer, substrate condition, and other processing parameters. Small variations in processing conditions and/or poor coverage of the wetting layer can result in incomplete filling of the contacts or vias, thus creating voids. Hot PVD Al processes may be performed at temperatures above about 450° C. Because the PVD wetting process provides poor coverage of high aspect ratio, sub-micron via sidewalls, hot PVD Al does not provide reliable filling of the contacts or vias. Even at higher temperatures, PVD processes may result in a bridging effect whereby the opening of the contact or via is closed because the deposition layer formed on the top surface of the substrate and the upper walls of the contact or via join before the floor of the contact or via has been completely filled.

One attempt at filling high aspect ratio sub-quarter micron contacts and vias, disclosed in U.S. Pat. No. 5,877,087, incorporated by reference herein, uses a thin bonding layer deposited first over the surface of the contacts or vias, followed by a CVD layer, and then a PVD layer. The thin bonding layer is preferably a metal having a relatively higher melting point temperature than the subsequent CVD and PVD metals. However, the problem of the via or contact opening being bridged by the CVD and PVD processes still remains, and voids may still form in the contacts or vias. Furthermore, the crystalline structure of the aluminum deposited by the methods described in U.S. Pat. No. 5,877,087 may not be optimal.

Another attempt at filling high aspect ratio sub-quarter micron contacts and vias is disclosed in U.S. patent application Ser. No. 09/127,010. U.S. patent application Ser. No. 09/127,010 describes depositing a metal layer in an aperture formed on a substrate by CVD, annealing the substrate at a low pressure to eliminate any voids in the metal, and depositing another metal layer by PVD. While this process may reduce the number of voids in a structure, a method of depositing aluminum with improved surface morphology and/or crystalline growth is still desired. Therefore, there is a need for a process for depositing metals that results in the formation of a substrate with a smoother and/or improved surface morphology.

SUMMARY OF THE INVENTION

The present invention generally provides a method for depositing metal in an aperture formed on a substrate. More particularly, the present invention provides a method for filling apertures, such as high aspect ratio, sub-quarter micron contacts and vias.

One aspect of the invention provides a method for forming a feature on a substrate by chemical vapor depositing a first metal on the substrate to provide conformal coverage of the aperture surfaces. A second metal is physical vapor deposited over the first metal at a low temperature, i.e., a substrate temperature between about 25° C. and about 300° C. The physical vapor deposition is performed without any backside gas or chucking. The substrate is then heated to a temperature, such as between about 400° C. and about 550°

C. Heating the substrate allows the deposited metal to reflow and substantially fill the aperture with few if any voids. The metal deposition and heating steps contribute to a smooth surface morphology of the substrate.

Another aspect of the invention further provides depositing a wetting layer on the substrate before chemical vapor depositing a first metal on the substrate. After the substrate is treated with the physical vapor desposition and heating steps provided in the first aspect of the invention, another metal is physical vapor deposited, preferably using a high power and a high temperature, on the substrate. Optionally, the substrate is then heated to allow the deposited metals to reflow and to further enhance the surface morphology of the substrate.

In another aspect of the invention, the processes described herein are performed in an integrated processing system that includes both a PVD and a CVD processing chamber. All of the PVD and heating steps in the present processes may be performed in one PVD chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of the inventions and are therefore not to be considered limiting of their scope, for the invention may admit to other equally effective embodiments.

DETAILED DESCRIPTION OF THE PREFERRED EMBODIMENT

The present invention generally provides a method for depositing metal in an aperture of a substrate. Using embodiments of the processes described herein, an aperture may be filled with metal that is substantially void-free and has a uniform surface morphology.

Figure 1:
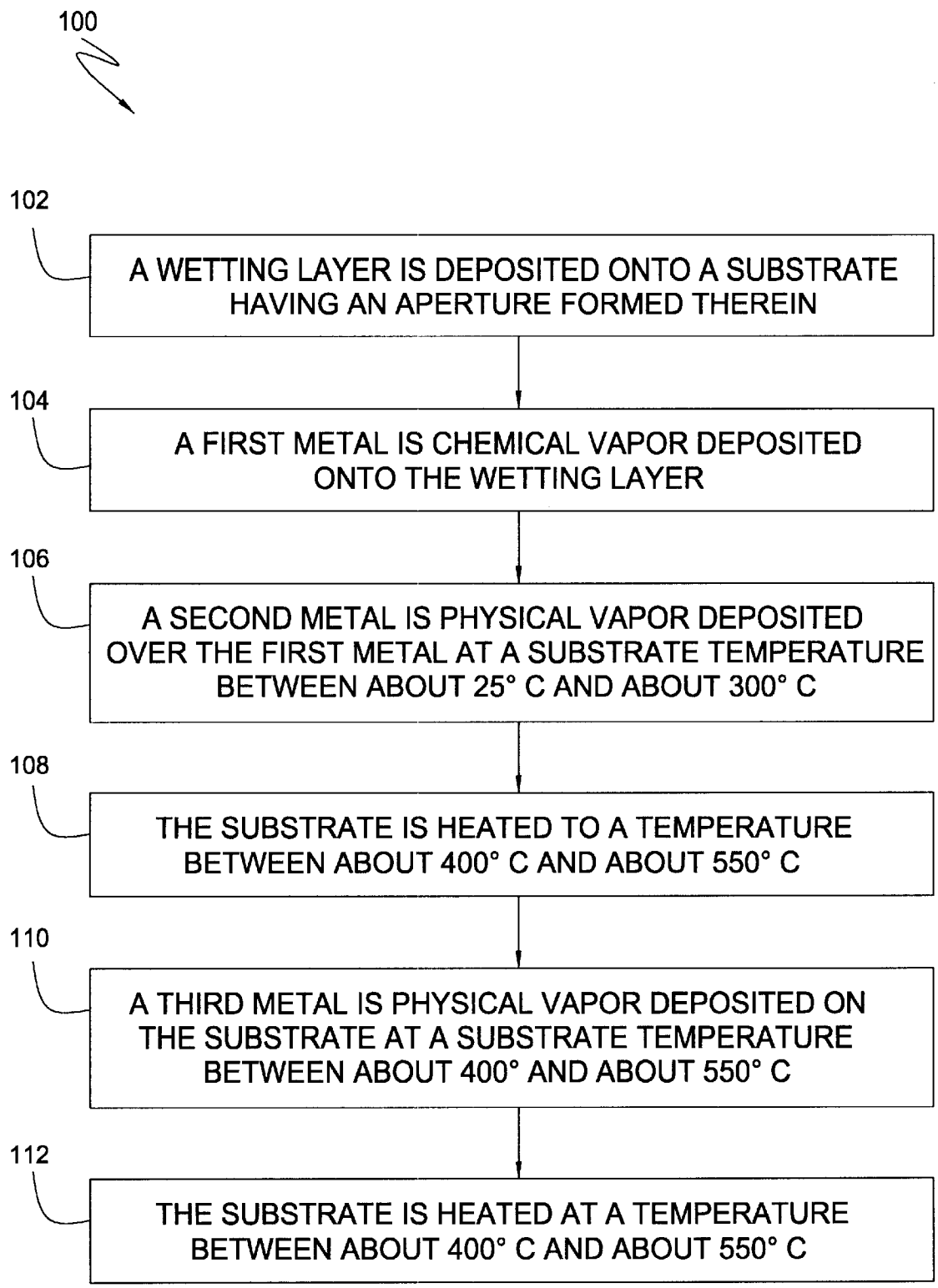
FIG. 1 is a flow diagram illustrating the steps of an embodiment.

FIG. 1 is a flow diagram 100 illustrating the steps of one embodiment of the invention. A substrate having one or more apertures, such as vias or other features formed therein has a wetting layer deposited thereon in step 102. A first metal is chemical vapor deposited on the wetting layer in step 104. A second metal is physical vapor deposited over the first metal at a low temperature, such as a substrate temperature between about 25° C. and about 300° C. in step 106. The substrate is heated to a temperature between about 400° C. and about 550° C. in step 108. A third metal is deposited on the substrate by physical vapor deposition at a substrate temperature between about 400° C. and about 550° C. in step 110. The substrate is heated at a temperature between about 400° C. and about 550° C. in step 112.

Figure 2:
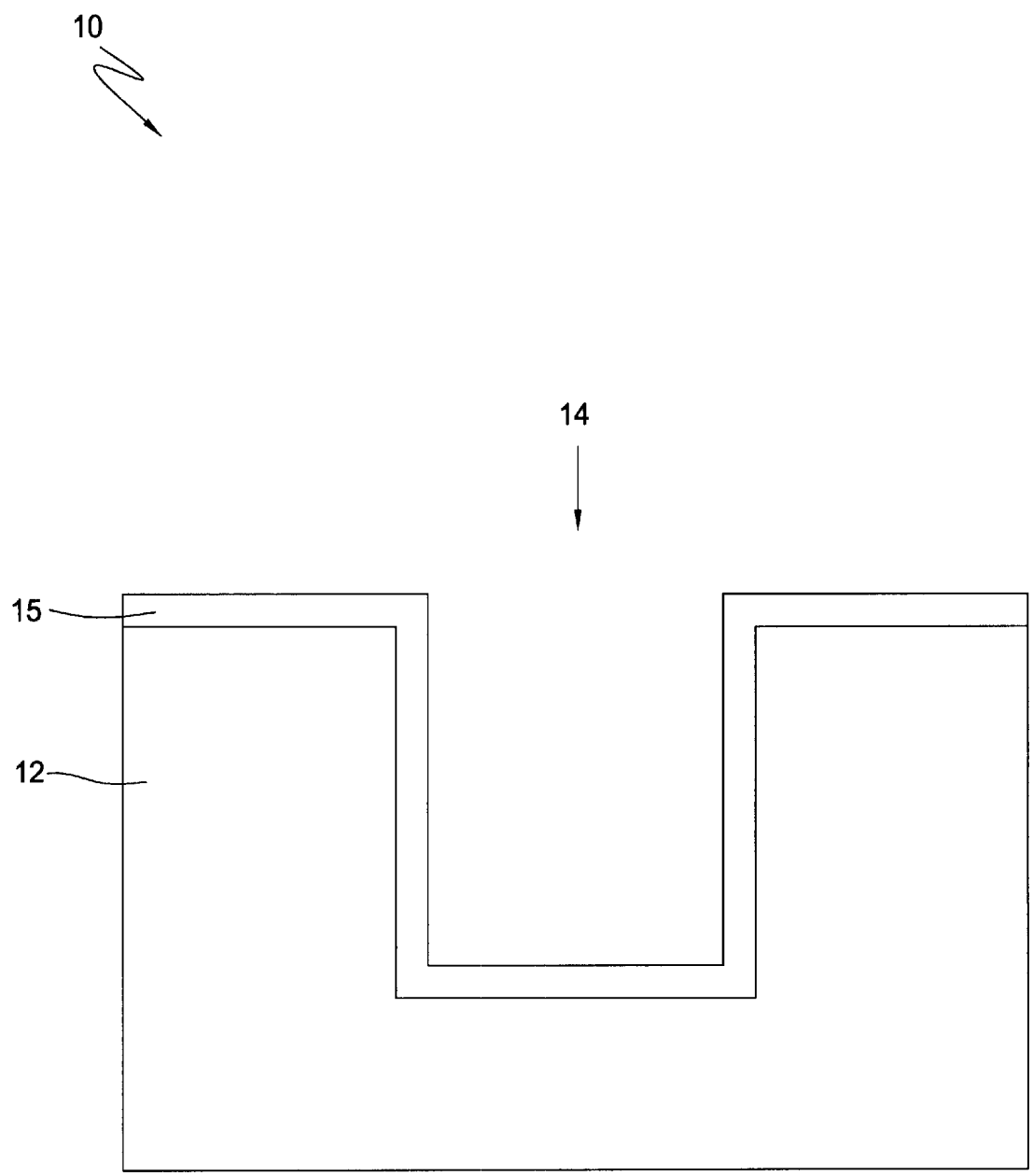
FIGS. 2–7 are cross sectional views showing one embodiment of a deposition sequence on a substrate.

According to one embodiment of the invention, a wetting layer 15 is deposited on a substrate 10 having an aperture, such as a via 14, formed therein, as shown in FIG. 2. A dielectric layer 12 on the surface of the substrate 10, typically etched in a desired pattern, is shown including a via 14 having a high aspect ratio, i.e., a high ratio of via depth to via width, typically at least about three. The wetting layer 15 may be a thin layer of a refractory material such as titanium (Ti), titanium nitride (TiN), tantalum (Ta), tantalum nitride (TaN), niobium, aluminum silicates, silica, alumina, or combinations thereof. However, the wetting layer 15 can comprise other materials, such as tungsten (W) or other metals. The wetting layer 15 may be deposited by PVD, CVD, or other methods. Chambers that may be used to deposit the wetting layer, such as a refractory metal layer, include PVD chambers such as IMP™ chambers, ALPS™ chambers, DURASOURCE® chambers, all of which are available from Applied Materials, Inc., of Santa Clara, Calif. Other chambers that may be used include Standard and Coherent chambers, available from Applied Materials, Inc., of Santa Clara, Calif. A CVD chamber that may be used to deposit a wetting layer, such as a refractory metal layer, is a TxZ™ chamber, available from Applied Materials, Inc., of Santa Clara, Calif.

Figure 3:
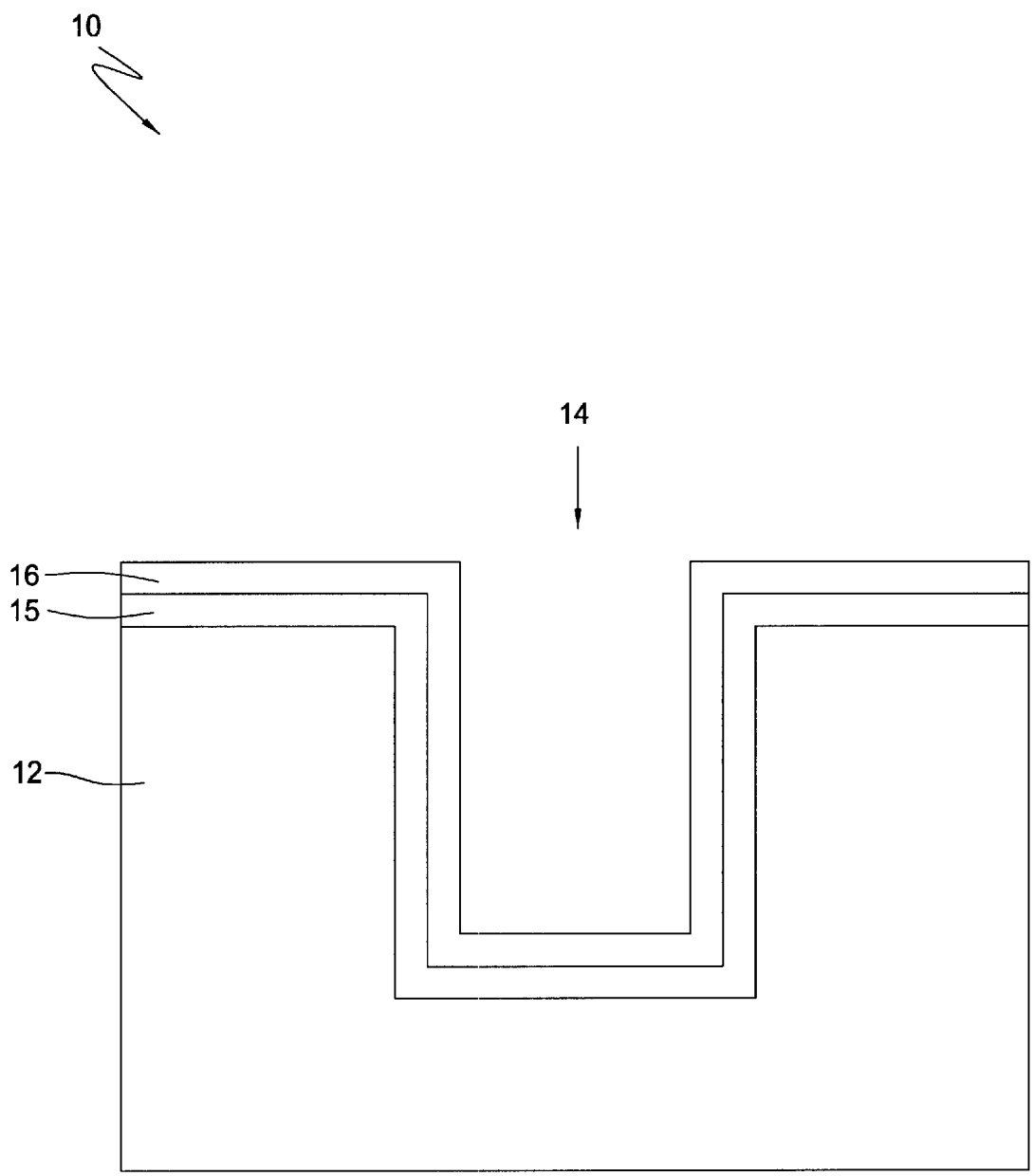
Figure 4:
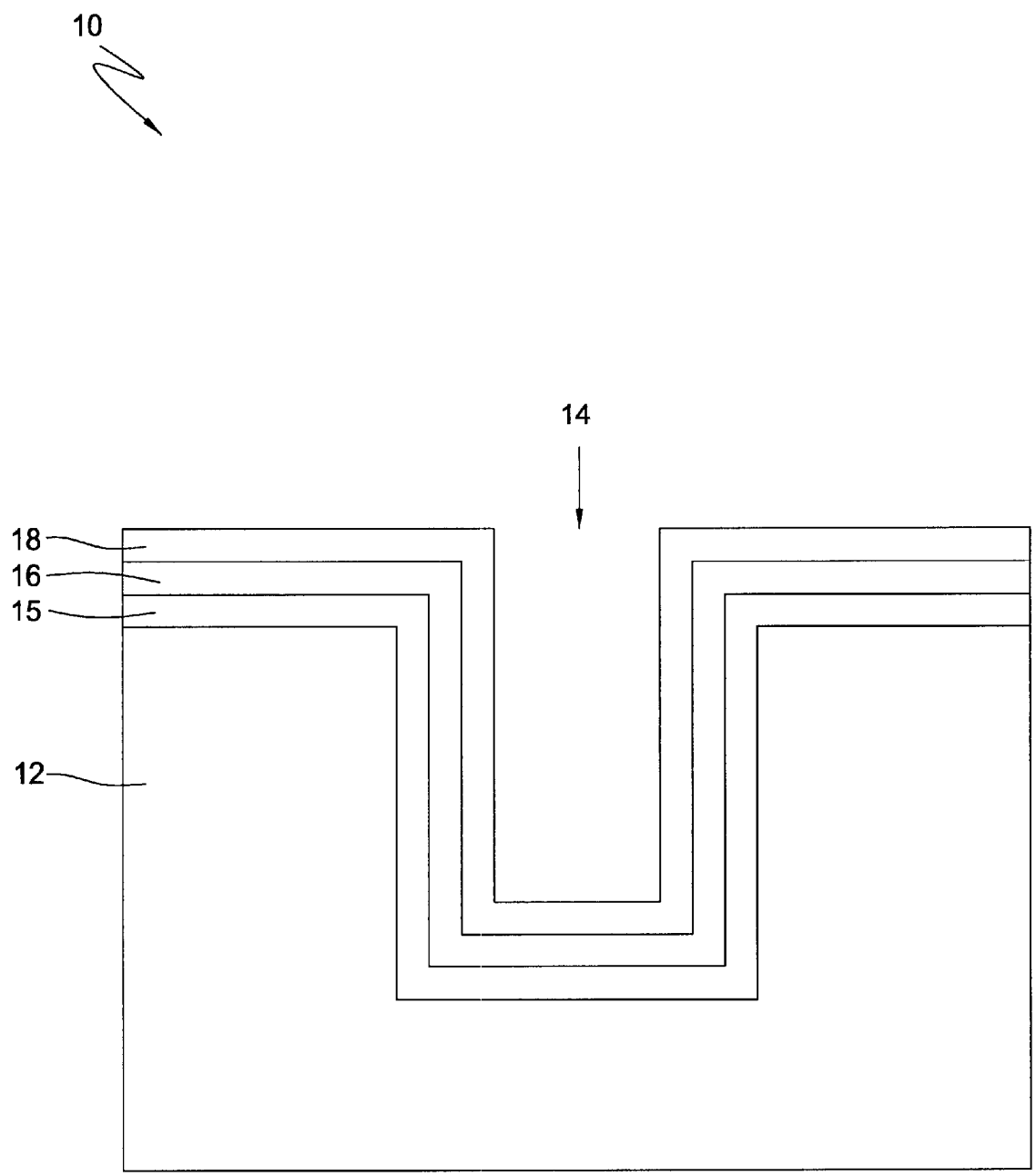

A layer of metal 16, such as aluminum, is then deposited on the substrate 10, as shown in FIG. 3. Preferably, the metal 16 is deposited by CVD to provide a conformal layer of metal in the via 14. An example of a CVD chamber that may be used to deposit the conformal metal layer is an AxZ™ chamber, available from Applied Materials, Inc., of Santa Clara, Calif. Another layer of metal 18, such as aluminum, is then deposited on the substrate 10, as shown in FIG. 4. The layer of metal 18 is deposited by PVD at a high power, such as between about 5 and about 20 kilowatts, e.g., about 10 kilowatts. The power density may be between about 0.04 and about 0.16 kilowatts per square inch, e.g., about 0.08 kilowatts per square inch. PVD chambers that may be used to deposit the metal layer include Standard and ALPS™ chambers. The chamber pressure during PVD may be between about 0.5 mTorr and 5 mTorr. The layer of metal 18 deposited may have a thickness of between about 500 Å and about 2,000 Å. This thickness may increase or decrease depending on the size of the feature. Smaller features require less material and larger features require more material. The PVD is performed without any backside gas or chucking. Therefore, while the temperature in the PVD chamber may be between about 400° C. and about 550° C., the substrate temperature may be between about 25° C. and about 300° C. Known PVD processes are typically performed with the substrate held at higher temperatures, such as between about 400° C. and about 500° C. It is believed that the cool PVD conditions described herein contribute to a smaller grain size of the PVD deposited metal and a better surface morphology of the PVD deposited metal. By using a high power during PVD, the metal can be deposited quickly before the substrate reaches a higher than desired temperature. Furthermore, it is believed that the high power during PVD contributes to the deposition of more uniformly sized grains than a lower power and slower PVD process.

Figure 5:
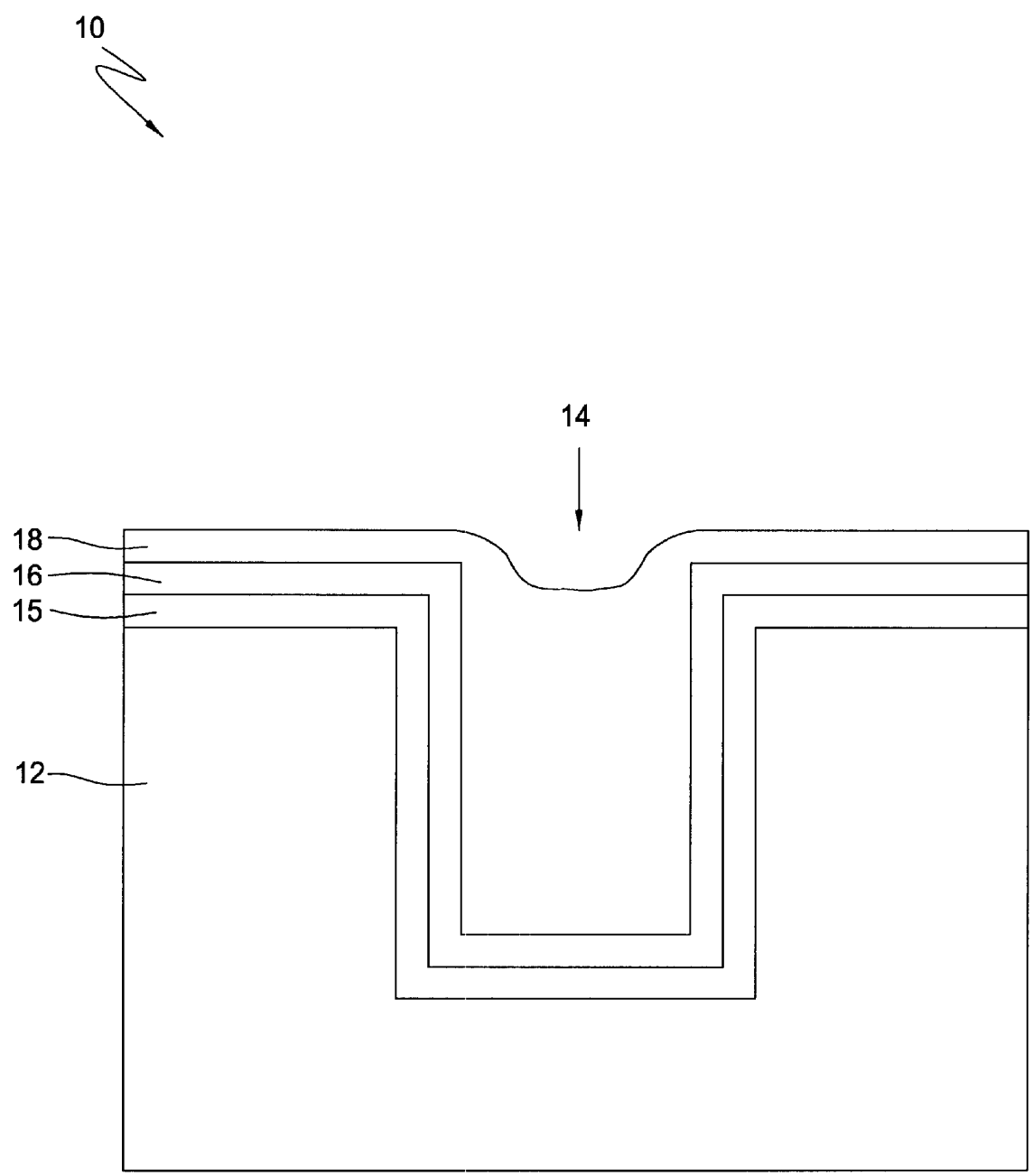

After the substrate is treated with the high power PVD process for a short period of time, such as between about 3 seconds and about 10 seconds, the deposition is terminated, and the backside gas is then turned on. Following deposition, the substrate temperature is elevated to between about 400° C. and about 550° C. The pressure on the backside of the substrate is stabilized during a period of time, such as about 15 seconds, after the backside gas is turned on. Turning on the backside gas raises the substrate temperature to the range between about 400° C. and about 550° C. The heating of the substrate to between about 400° C. and about 550° C. may be continued for a period of time, such as for between about 30 seconds to about 60 seconds, after the pressure on the backside of the substrate is stabilized. Within such a temperature range, the deposited metals reflow and flow to the bottom of the via and fill the bottom of the via 14, as shown in FIG. 5. Depending on the size of the via, the via may be substantially filled with the deposited metals. While one via is shown and discussed, typically a plurality of vias are simultaneously filled on a given substrate. The substantially filled via 14 has few if any voids. It is believed that the combination of the previous cool PVD step and the heating step provide a good substrate surface morphology and substantially void-free filling of the via.

Figure 6:
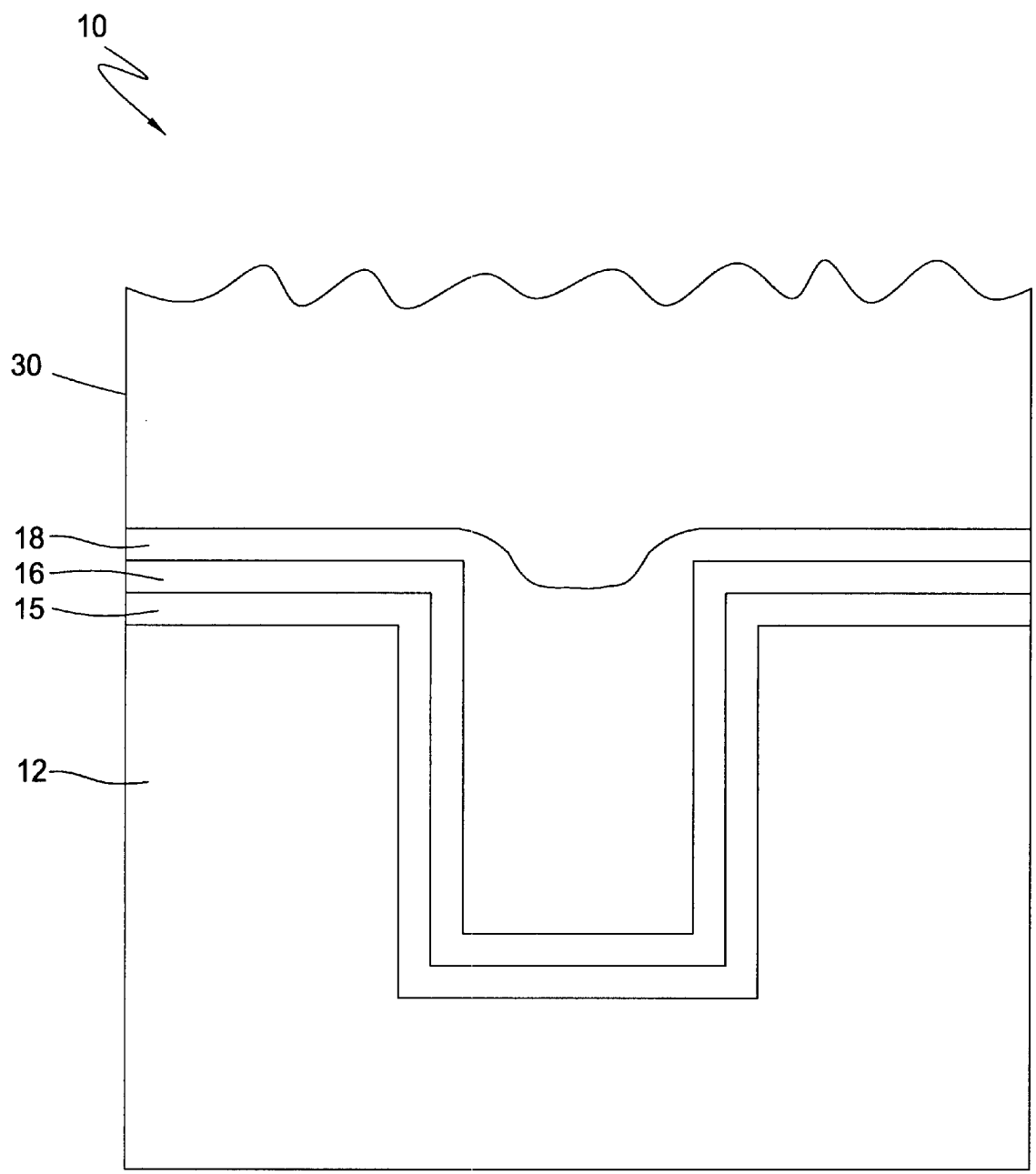

The substrate 10 may then be treated with another PVD step to deposit a metal 30, such as aluminum, on the substrate, as shown in FIG. 6. PVD chambers that may be used to deposit the metal layer include Standard and ALPS™ chambers. The metal 30 is deposited by PVD at a high power, such as between about 5 and about 20 kilowatts, e.g., about 10 kilowatts. The power density may be between about 0.04 and about 0.16 kilowatts per square inch, e.g., about 0.08 kilowatts per square inch. The metal 30 deposited may have a thickness of between about 3,000 Å and about 15,000 Å. The metal 30 may fill the via 14 if the via was not previously filled and/or improve the surface morphology of the substrate. The PVD is performed at a high temperature, e.g., between about 400° C. and about 550° C. The temperature of both the PVD chamber and the substrate is preferably between about 400° C. and about 550° C. The high power of the PVD process contributes to a fast PVD step that increases the throughput of substrates during processing. Furthermore, it is believed that the high power used during PVD contributes to the deposition of more uniformly sized grains than a lower power and slower PVD process.

Figure 7:
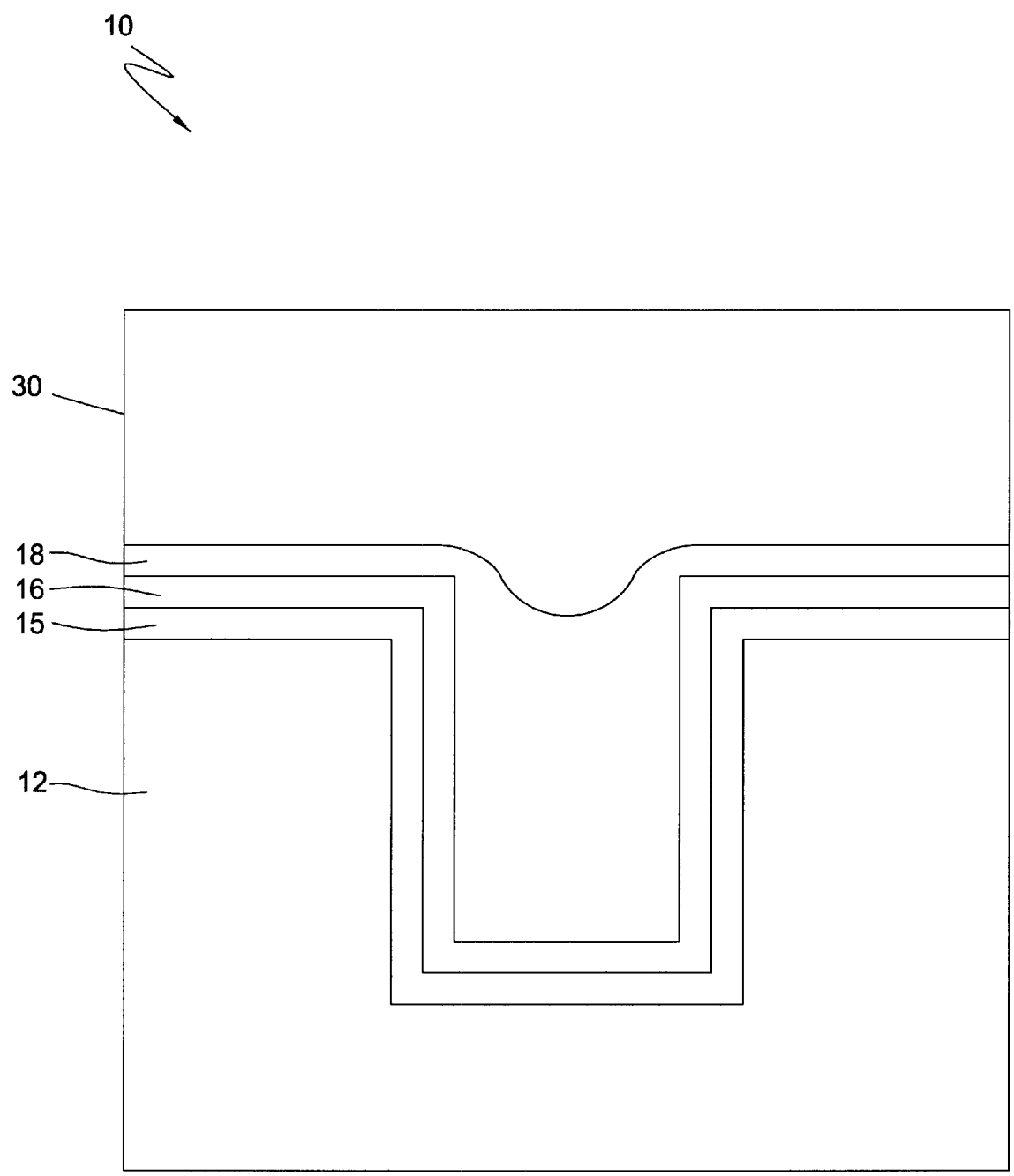

Optionally, the substrate 10 is then heated to allow the deposited metals to reflow and to further enhance the surface morphology of the substrate, as shown in FIG. 7. It is believed that heating the substrate minimizes the deep grain boundaries that may be formed during high temperature PVD. The substrate is heated at a temperature, such as between about 400° C. and about 550° C., e.g., about 450° C. The substrate may already be at the desired temperature as a result of the previous PVD step. The substrate may be heated for up to about 100 seconds or whatever time necessary to allow the deposited metals to reflow and/or further enhance the surface morphology of the substrate.

In one aspect, embodiments of the methods described herein may be used to deposit material in an aperture formed in a substrate, wherein the aperture has a high aspect ratio, such as about 3:1 or greater, e.g., about 4:1 or greater.

In one embodiment, the processes described herein are performed within an integrated processing system typically used in processing semiconductor substrates. One staged-vacuum substrate processing system is disclosed in U.S. Pat. No. 5,186,718, entitled "Staged-Vacuum Wafer Processing System and Method," Tepman et al., issued on Feb. 16, 1993, which is incorporated herein by reference. An example of an integrated processing system that may be used to perform the processes described herein is the Endura® system, available from Applied Materials, Inc. of Santa Clara, Calif.

According to an embodiment of the present invention, a substrate is loaded into a processing system and transferred into a metal deposition chamber or chambers, such as CVD or PVD chambers, to form a wetting layer, such as a Ti, TiN, or Ti/TiN layer, on the substrate. The substrate is then transferred into a CVD chamber where a CVD metal layer is deposited on the substrate. Optionally, there may be a vacuum break or an air break, i.e., an exposure of the substrate to air, after the deposition of the wetting layer and before the CVD step. Thus, the processes described herein may be performed in a series of chambers that are not part of one integrated processing system. The substrate is then transferred into a PVD chamber for a low temperature PVD process, I.e., a PVD process wherein the substrate temperature is between about 25° C. to about 300° C. The substrate may then be heated, such as to a temperature between about 400° C. to about 550° C., treated with a high temperature PVD process, i.e., a PVD process wherein the substrate temperature is between about 400° C. and about 550° C. Optionally, the substrate may receive further heating. The low temperature PVD process, heating, high temperature PVD process and further heating steps may be performed within one PVD chamber.

TABLE 1

| PVD Process | Process Sequence | Reflectivity |
|---|---|---|
| Cool Al | Ti/CVD Al/PVD Al | 195% |
|  | Ti/treated TiN/Air break/CVD Al/PVD Al | 139% |
|  | Ti/un- treated TiN/Air break/CVD Al/PVD Al | 100% |
| CVD Al reflow | Ti/treated TIN/Air break/CVD Al/PVD Al | 192% |
|  | Ti/un- treated TiN/Air break/CVD Al/PVD Al | 147% |
|  | Ti(low T)/un- treated TIN/Air break/ CVD Al/PVD Al | 91% |
| Multi-step PVD | Ti/CVD Al/PVD Al | 205% |
|  | Ti/treated TiN/Air break/CVD Al/PVD Al | 207% |
|  | Ti/un- treated TiN/Air break/CVD Al/PVD Al | 195% |
|  | Ti (low T)/un- treated TiN/Air break/ CVD Al/PVD Al | 188% |

Table 1 shows a comparison of the reflectivity of aluminum films deposited by embodiments of the invention and by previously known methods. Different substrates were treated with one of the following PVD processes: Cool Al, CVD Al reflow, and multi-step PVD. The Cool Al deposition process includes the deposition of aluminum by a PVD process using a low power, such as about 2 kilowatts or about 0.01 kilowatts per square inch, and a high temperature, such as between about 400° C. and about 500° C. for both the substrate and the chamber. The CVD Al reflow process includes a heating step before a PVD process using a higher power, such as about 8 kilowatts or about 0.06 kilowatts per square inch, and a high temperature, such as between about 400° C. and about 500° C. for both the substrate and the chamber. The multi-step PVD Al includes the low temperature PVD process, heating, high temperature PVD process, and heating steps described in the present application. The substrates were treated with one of the above PVD processes as part of the process sequences listed in Table 1. The sequences listed in Table 1 refer to the materials deposited on a substrate, the deposition methods, and any air breaks that the substrate experienced during the processing steps. In sequence 1, titanium, CVD Al, and PVD Al were deposited on substrates. The PVD Al was deposited by one of the PVD processes described above with respect to Cool Al, CVD Al reflow, and the multi-step PVD Al. In sequence 2, titanium and plasma-treated titanium nitride were deposited on substrates. The substrates were then exposed to air before CVD Al and PVD Al were deposited on the substrates. The PVD Al was deposited by one of the PVD processes described above with respect to Cool Al, CVD Al reflow, and the multi-step PVD Al. In sequence 3, titanium and titanium nitride that was not plasma treated were deposited on substrates. The substrates were then exposed to air before CVD Al and PVD Al were deposited on the substrates. The PVD Al was deposited by one of the PVD processes described above with respect to Cool Al, CVD Al reflow, and the multi-step PVD Al. In sequence 4, titanium deposited at a low temperature (low T), such as room temperature, and titanium nitride that was not plasma treated were deposited on the substrates. The substrates were then exposed to air before CVD Al and PVD Al were deposited on the substrates. Different substrates were treated with one of the PVD processes described above with respect to Cool Al, CVD Al reflow, and the multi-step PVD Al.

The percentages shown in Table 1 are the reflectivities of the substrates measured at 436 nm with respect to the reflectivity of a silicon substrate (set to 100%) that has not received deposited materials. It can be seen that Al films deposited by the PVD processing steps described herein are more reflective than Al films deposited by previous PVD methods. Good reflectivity is generally accepted as an indicator of smooth surface morphology of a substrate. In particular, the PVD processing steps described herein improve the reflectivity of substrates that include un-treated TiN and/or Ti deposited at a low temperature. It is believed that untreated TiN does not have the ordered crystalline properties of plasma treated TiN. Ti deposited at low temperatures has a low amount of the <002> orientation that contributes to the formation of Al with a desirable <111> orientation. Therefore, it has been considered more difficult to achieve a desirable surface morphology with substrates having un-treated TiN and/or Ti deposited at a low temperature. As can be seen from Table I, substrates including un-treated TiN and treated with the multi-step PVD described herein have a reflectivity of approximately 195% compared to reflectivities of 100% and 147% for substrates treated with prior PVD processes. Substrates including both Ti deposited at a low temperature and un-treated TiN and treated with the multi-step PVD described herein have a reflectivity of approximately 188% compared to a reflectivity of 91% for substrates treated with prior PVD processes.

Scanning electron micrographs (SEMs) (not shown) of aluminum films deposited either by a Cool Al process or the multi-step PVD Al process described herein show that aluminum deposited by the multi-step PVD Al process described herein typically has a smoother surface morphology than aluminum deposited by a Cool Al process.

While the foregoing is directed to embodiments of the present invention, other and further embodiments of the invention may be devised without departing from the basic scope thereof, and the scope thereof is determined by the claims that follow.

What is claimed is:

1. A method of forming a feature on a substrate having an aperture formed therein, comprising:
   a) chemical vapor depositing a first metal on the substrate;
   b) physical vapor depositing a second metal over the first metal at a substrate temperature between about 25° C. and about 300° C. without applying backside gas to the substrate; and then
   c) heating the substrate to a temperature between about 400° C. and about 550° C.

2. The method of claim 1, each metal is aluminum.

3. The method of claim 1, wherein heating the substrate comprises applying backside gas to the substrate.

4. The method of claim 3, wherein the pressure on the backside of the substrate is stabilized after the backside gas is applied to the substrate, and the substrate is heated for a period of time after the pressure is stabilized.

5. The method of claim 4, wherein the period of time is between about 30 seconds and about 60 seconds.

6. The method of claim 1, further comprising depositing a wetting layer on the substrate before chemical vapor depositing the first metal on the substrate.

7. The method of claim 6, wherein the wetting layer is selected from the group of titanium (Ti), titanium nitride (TiN), tantalum (Ta), tantalum nitride (TaN), niobium, aluminum silicates, silica, alumina, and combinations thereof.

8. A method of forming a feature on a substrate having an aperture formed therein, comprising:
   a) chemical vapor depositing a first metal on the substrate;
   b) physical vapor depositing a second metal over the first metal at a substrate temperature between about 25° C. and about 300° C.;
   c) heating the substrate to a temperature between about 400° C. and about 550° C.; and
   d) physical vapor depositing a third metal over the second metal.

9. The method of claim 8, wherein the third metal is physical vapor deposited at a power of between about 5 kilowatts and about 20 kilowatts.

10. The method of claim 8, wherein the third metal fills the aperture.

11. The method of claim 8, wherein between about 3,000 Å to about 15,000 Å of the third metal is deposited.

12. The method of claim 8, wherein each metal is aluminum.

13. The method of claim 8, wherein the third metal is physical vapor deposited at a substrate temperature between about 400° C. and about 550° C.

14. The method of claim 8, further comprising heating the substrate at a temperature between about 400° C. and about 550° C. after physical vapor depositing the third metal.

15. The method of claim 14, wherein the substrate is heated for up to 100 seconds after physical vapor depositing the third metal.

16. The method of claim 1, wherein the second metal is physical vapor deposited at a power of between about 5 kilowatts and about 20 kilowatts.

17. The method of claim 16, wherein between about 500 Å to about 2,000 Å of the second metal is deposited.

18. The method of claim 1, wherein physical vapor depositing the second metal and heating the substrate are performed in one chamber.

19. A method of forming a feature on a substrate having an aperture formed therein, comprising:
   a) depositing a wetting layer over the surfaces of the aperture of the substrate;
   b) chemical vapor depositing a first metal over the wetting layer;
   c) physical vapor depositing a second metal over the first metal at a substrate temperature between about 25° C. and about 300° C. without applying backside gas to the substrate: and then
   d) heating the substrate to a temperature between about 400° C. and about 550° C.

20. The method of claim 19, wherein each metal is aluminum.

21. The method of claim 19, wherein heating the substrate comprises applying backside gas to the substrate.

22. The method of claim 21, wherein the pressure on the backside of the substrate is stabilized after the backside gas is applied to the substrate, and the substrate is heated for a period of time after the pressure is stabilized.

23. The method of claim 22, wherein the period of time is between about 30 seconds and about 60 seconds.

24. A method of forming a feature on a substrate having an aperture formed therein, comprising:
   a) depositing a wetting layer over the surfaces of the aperture of the substrate;

b) chemical vapor depositing a first metal over the welling layer;

c) physical vapor depositing a second metal over the first metal at a substrate temperature between about 25° C. and about 300° C.;

d) heating the substrate to a temperature between about 400° C. and about 550° C.; and e) physical vapor depositing a third metal over the second metal after heating the substrate.

25. The method of claim 24, wherein the third metal is physical vapor deposited at a substrate temperature between about 400° C. and about 550° C.

26. The method of claim 24, further comprising heating the substrate at a temperature between about 400° C. and about 550° C. after physical vapor depositing the third metal.

27. The method of claim 19, wherein physical vapor depositing a second metal and heating the substrate are performed in one chamber.

28. A method of forming a feature on a substrate having an aperture formed therein, comprising:

a) depositing a wetting layer over the surfaces of the aperture of the substrate;

b) chemical vapor depositing a first metal over the wetting layer;

c) physical vapor depositing a second metal over the first metal at a substrate temperature between about 25° C. and about 300° C.; and then d) heating the substrate to a temperature between about 400° C. and about 550° C.;

e) physical vapor depositing a third metal over the second metal; and f) heating the substrate at a temperature between about 400° C. and about 550° C. after physical vapor depositing the third metal.

29. The method of claim 28, wherein each metal is aluminum.

30. The method of claim 28, wherein the third metal is physical vapor deposited at a substrate temperature between about 400° C. and about 550° C.

31. The method of claim 28, wherein the second metal is physical vapor deposited without applying backside gas to the substrate.

32. The method of claim 31, wherein heating the substrate comprises applying backside gas to the substrate.

33. The method of claim 32, wherein the pressure on the backside of the substrate is stabilized after the backside gas is applied to the substrate, and the substrate is heated for a period of time after the pressure is stabilized.

34. The method of claim 33, wherein the period of time is between about 30 seconds and about 60 seconds.

35. The method of claim 28, wherein physical vapor depositing a second metal, then heating the substrate, physical vapor depositing a third metal, and heating the substrate after physical vapor depositing the third metal are performed in one chamber.

36. A method of depositing material in an aperture formed in a substrate, comprising:

a) depositing a wetting layer over the surfaces of the aperture of the substrate, the aperture having an aspect ratio of about 3:1 or greater;

b) chemical vapor depositing a first metal over the wetting layer;

c) physical vapor depositing a second metal over the first metal at a substrate temperature between about 25° C. and about 300° C.; and then d) heating the substrate to a temperature between about 400° C. and about 550° C.;

e) physical vapor depositing a third metal over the second metal; and f) heating the substrate at a temperature between about 400° C. and about 550° C. after physical vapor depositing the third metal.

37. The method of claim 36, wherein each metal is aluminum.

38. The method of claim 36, wherein the third metal is physical vapor deposited at a substrate temperature between about 400° C. and about 550° C.

39. The method of claim 36, wherein the second metal is physical vapor deposited without applying backside gas to the substrate.

40. The method of claim 39, wherein heating the substrate comprises applying backside gas to the substrate.

41. The method of claim 40, wherein the pressure on the backside of the substrate is stabilized after the backside gas is applied to the substrate, and the substrate is heated for a period of time after the pressure is stabilized.

42. The method of claim 41, wherein the period of time is between about 30 seconds and about 60 seconds.

43. The method of claim 36, wherein physical vapor depositing a second metal, then heating the substrate, physical vapor depositing a third metal, and heating the substrate after physical vapor depositing the third metal are performed in one chamber.

44. The method of claim 36, wherein the second metal is physical vapor deposited at a power of between about 5 kilowatts and about 20 kilowatts.

45. The method of claim 44, wherein the third metal is physical vapor deposited at a power of between about 5 kilowatts and about 20 kilowatts.

* * * * *

UNITED STATES PATENT AND TRADEMARK OFFICE
CERTIFICATE OF CORRECTION

PATENT NO. : 6,716,733 B2
DATED : April 6, 2004
INVENTOR(S) : Lee et al.

It is certified that error appears in the above-identified patent and that said Letters Patent is hereby corrected as shown below:

Column 6,
Line 5, please change "Le.," to -- i.e., --

Signed and Sealed this

Twenty-eighth Day of September, 2004

JON W. DUDAS
*Director of the United States Patent and Trademark Office*